(12) United States Patent
Sweet et al.

(10) Patent No.: US 12,218,481 B2
(45) Date of Patent: Feb. 4, 2025

(54) LASER SAFETY CIRCUIT PROVIDING FREQUENCY-BASED AVERAGE CURRENT MONITORING

(71) Applicant: Apple Inc., Cupertino, CA (US)

(72) Inventors: Stephen N. Sweet, San Jose, CA (US); Dong Zheng, Los Altos, CA (US)

(73) Assignee: APPLE INC., Cupertino, CA (US)

( * ) Notice: Subject to any disclaimer, the term of this patent is extended or adjusted under 35 U.S.C. 154(b) by 988 days.

(21) Appl. No.: 17/211,761

(22) Filed: Mar. 24, 2021

(65) Prior Publication Data

US 2022/0311211 A1 Sep. 29, 2022

(51) Int. Cl.
*H01S 5/068* (2006.01)
*H01S 3/13* (2006.01)

(52) U.S. Cl.
CPC ........... *H01S 5/06808* (2013.01); *H01S 3/13* (2013.01)

(58) Field of Classification Search
CPC ...... H01S 5/06808; H01S 3/13; H01S 5/0428; H01S 5/0617; H01S 5/4025; H01S 5/06825
See application file for complete search history.

(56) References Cited

U.S. PATENT DOCUMENTS

| | | | |
|---|---|---|---|
| 4,856,011 A * | 8/1989 | Shimada | H01S 5/042 315/149 |
| 6,370,175 B1 | 4/2002 | Ikeda et al. | |
| 7,124,950 B2 | 10/2006 | Blake et al. | |
| 7,982,526 B2 | 7/2011 | Lee | |
| 8,089,317 B2 | 1/2012 | Fujiwara et al. | |
| 2002/0172242 A1* | 11/2002 | Seo | G11B 7/1263 |
| 2002/0176461 A1* | 11/2002 | Nihei | G11B 7/1263 |
| 2010/0040099 A1* | 2/2010 | Blauvelt | H04B 10/564 372/31 |
| 2017/0241890 A1* | 8/2017 | Matsui | G01N 15/1459 |
| 2017/0288369 A1 | 10/2017 | Ikram et al. | |

* cited by examiner

*Primary Examiner* — Xinning(Tom) Niu
(74) *Attorney, Agent, or Firm* — Brownstein Hyatt Farber Schreck, LLP

(57) ABSTRACT

A method of operating a laser includes generating a first signal having a first frequency, and generating a second signal having a second frequency. The first frequency varies in accord with an amplitude of a drive current provided to a laser. The method further includes incrementing or decrementing a count responsive to a relationship between the first frequency and the second frequency; determining the count satisfies a threshold count; and modifying operation of the laser when the count satisfies the threshold count.

20 Claims, 12 Drawing Sheets

LASER SAFETY CIRCUIT PROVIDING FREQUENCY-BASED AVERAGE CURRENT MONITORING

FIELD

The described embodiments relate generally to lasers. More particularly, the described embodiments relate to laser safety circuits that are used to enforce laser safety specifications.

BACKGROUND

Lasers may be used to provide illumination in various applications. For example, a laser may be used to illuminate particles, a surface, a sub-surface (e.g., veins below the skin), and so on. Lasers may provide visible light illumination (e.g., red light or green light), infrared (IR) illumination, and so on. Lasers may also provide flood illumination or structured illumination (e.g., illumination patterns including lines, spots, or dots of illumination).

In some cases, lasers may be used to illuminate an object for the purpose of imaging the object using a two-dimensional (2D) camera. In some cases, lasers may be used to illuminate an object for the purpose of imaging the object using a three-dimensional (3D) camera, or for determining a proximity or other parameters of an object. One example of a 3D camera is an array of single-photon avalanche diodes (SPADs) that measure times-of-flight (ToFs) of electromagnetic radiation pulses. Another example of a 3D camera is an array of self-mixing interferometry (SMI) sensors, in which each SMI sensor includes a laser that emits electromagnetic radiation from a resonant cavity, receives returns (e.g., reflections or scatter) of the emitted electromagnetic radiation back into the resonant cavity, and coherently self-mixes the emitted and received electromagnetic radiation to produce an SMI signal indicative of the speed, proximity, distance, surface quality, or other parameters of a particle, surface, or sub-surface illuminated by the electromagnetic radiation. In some cases, a single sensor pixel, instead of a camera, may be used to determine one or more parameters of a particle, surface, or sub-surface.

Lasers may also be used for illumination in the absence of imaging, or for optical communication, or for heating or cutting, or for other purposes.

SUMMARY

Embodiments of the systems, devices, methods, and apparatus described in the present disclosure are directed to laser safety circuits that are used to enforce laser safety specifications. Laser safety specifications may include, for example, a maximum peak power and a maximum average power. In some cases, a maximum peak power specification may be enforced by enforcing a maximum peak current (i.e., a maximum peak laser drive current). In some cases, a maximum average power specification may be enforced by enforcing a maximum average current (i.e., a maximum average laser drive current).

A laser's maximum peak current can be enforced using a current monitor. However, the means for enforcing a laser's maximum average current may depend on whether the laser has a fixed or variable firing rate. If a laser has a fixed firing rate, its maximum average current can be enforced by enforcing its maximum peak power (or current), in combination with a maximum duty cycle (i.e., a maximum period that the laser may be ON during a laser operating frame). If a laser has a variable firing rate, its maximum average current needs to be enforced by monitoring its power or current over time. In mathematical terms, obtaining an average current requires integrating the laser current over a running window time period, and normalizing to the time period of the window. The integration/normalization must be performed even when the laser is turned off, which increases the complexity of the average current monitoring circuitry and increases power consumption. Described herein are systems, devices, methods, and apparatus that enforce a laser's maximum average current specification using frequency-based average current monitoring.

In a first aspect, the present disclosure describes a laser safety circuit. The laser safety circuit may include a current-to-frequency converter configured to generate a first signal modulated at a first frequency. The first frequency may vary in accord with an amplitude of a drive current provided to a laser. The laser safety circuit may also include an oscillator configured to generate a second signal having a second frequency; an up/down counter configured to periodically increment or decrement a count responsive to a relationship between the first frequency and the second frequency, and assert an average current trip signal when the count satisfies a threshold count; and a control circuit configured to modify operation of the laser responsive to the assertion of the average current trip signal.

In another aspect, the present disclosure describes an electronic device. The electronic device may include a laser. The electronic device may also include a first circuit configured to generate a first signal having a first frequency, in which the first frequency varies in accord with an amplitude of a drive current provided to the laser; a second circuit configured to generate a second signal having a second frequency; a third circuit configured to periodically increment or decrement a count responsive to a relationship between the first frequency and the second frequency, and to assert an average current trip signal when the count satisfies a threshold count; and a fourth circuit configured to modify operation of the laser responsive to the assertion of the average current trip signal.

In still another aspect of the disclosure, the present disclosure describes a method of operating a laser. The method may include generating a first signal having a first frequency, and generating a second signal having a second frequency. The first frequency may vary in accord with an amplitude of a drive current provided to a laser. The method may also include incrementing or decrementing a count responsive to a relationship between the first frequency and the second frequency; determining the count satisfies a threshold count; and modifying operation of the laser when the count satisfies the threshold count.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
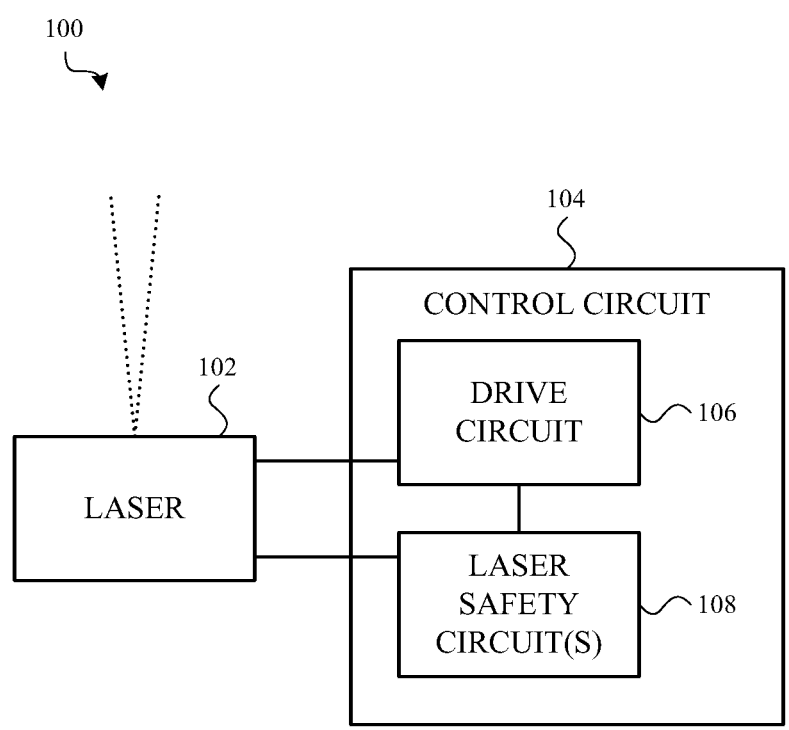
FIG. 1 shows an example block diagram of a laser system.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

As previously discussed, if a laser has a variable firing rate, its maximum average current needs to be enforced by monitoring its power or current over time. In some cases, this can be done by monitoring the laser's drive current using a current sense amplifier; converting the sensed value of the laser's drive current to a digital value using an analog-to-digital converter (ADC); using a digital moving average filter to monitor the laser's average drive current; and generating an average current trip signal when the average drive current exceeds a maximum average current specification. However, this sort of average current monitoring has some drawbacks. For example, it requires placing a current sensing element (e.g., a sense resistor) in series with the laser. This reduces the current headroom available to the laser. To minimize the reduction in current headroom, the resistance of the sense resistor may be made small. However, to obtain accurate current measurements with a small sense resistor, a high gain current sense amplifier and high resolution ADC are needed. A high gain current sense amplifier and high resolution ADC will typically consume a lot of power and require a lot of area. The high power consumption is due to the fact that the current sense amplifier and ADC operate in the analog domain and are running all of the time, even when the laser is off, because the laser contributes to the average current even when it is off. Another drawback of monitoring current using a sense resistor is that a low value sense resistor increases the likelihood of noisy current measurements, thereby reducing the performance of the average current monitoring. Furthermore, a sense resistor is subject to temperature coefficient (tempco) errors for which there may not be any compensation.

Described herein are systems, devices, methods, and apparatus that enforce a maximum average current specification using frequency-based average current monitoring. Frequency-based average current monitoring can provide improved performance with lower power consumption, and can be implemented in a smaller area (e.g., smaller die area) than a laser safety circuit requiring a current sense amplifier and an ADC. The frequency-based average current monitoring described herein replaces a sense resistor in series with a laser with a current-to-frequency (I/F) converter in a separate current mirror leg. Furthermore, the tempco error of a sense resistor is replaced with the tempco error of the current-to-frequency converter, which tempco error can be eliminated using standard tempco error compensation techniques. Also, in the described frequency-based average current monitoring systems, current integration and time normalization are performed using an up/down counter, and the up/down counter can be implemented with digital circuitry. This enables all of the analog circuitry (including the I/F converter) to be turned off when the laser is off, leaving the performance of current averaging to a digital up/down counter. A digital up/down counter consumes little current due to the nature of digital circuitry.

These and other aspects are described with reference to FIGS. 1-10. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "beneath", "left", "right", etc. may be used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include A, or B, or A and B.

FIG. 1 shows an example block diagram of a laser system 100. The laser system 100 includes a laser 102 and a control circuit 104.

By way of example, the laser 102 may be a semiconductor laser diode having a resonant cavity bounded by distributed Bragg reflectors (DBRs). In some embodiments, the laser 102 may be configured as an edge-emitting laser (EEL), a vertical cavity surface-emitting laser (VCSEL), or a horizontal cavity surface-emitting laser (HCSEL).

The control circuit 104 may include, for example, a drive circuit 106 and one or more laser safety circuits 108. The drive circuit 106 may be implemented at least partially in hardware (e.g., by discrete circuits), and in some cases may include firmware or software components. The drive circuit 106 may operate the laser 102 in accord with a drive current and a duty cycle, with the duty cycle determining the portion of a laser's operating frame in which the drive current is applied to the laser 102.

In some embodiments, the laser 102 may be operated with a fixed laser firing rate, in which the duty cycle of the laser 102 is fixed. For example, the duty cycle may be fixed but for variations due to manufacturing tolerances or environmental effects (e.g., thermal effects). In other embodiments, the laser 102 may be operated with a variable laser firing rate, in which the duty cycle of the laser may be varied.

The laser safety circuit(s) 108 may be implemented by hardware (e.g., circuits), firmware, or software, and may include at least one laser safety circuit implemented at least partially in hardware. The laser safety circuit(s) 108 may enforce various laser operating conditions, which conditions may be established for the safety of a user or the safety of the laser system 100.

In some embodiments, the laser safety circuit(s) 108 may enforce a maximum peak current (i.e., a maximum peak drive current for the laser 102) or a maximum average current (i.e., a maximum average drive current for the laser 102). The maximum peak current may be enforced using a current monitor, for example. For a system in which the laser 102 is operated with a fixed laser firing rate, the maximum average current may be enforced by enforcing a maximum peak power and a maximum duty cycle. However, for a system in which the laser 102 may be operated with a variable laser firing rate, current monitoring over time is needed to enforce the maximum average current.

Figure 2:
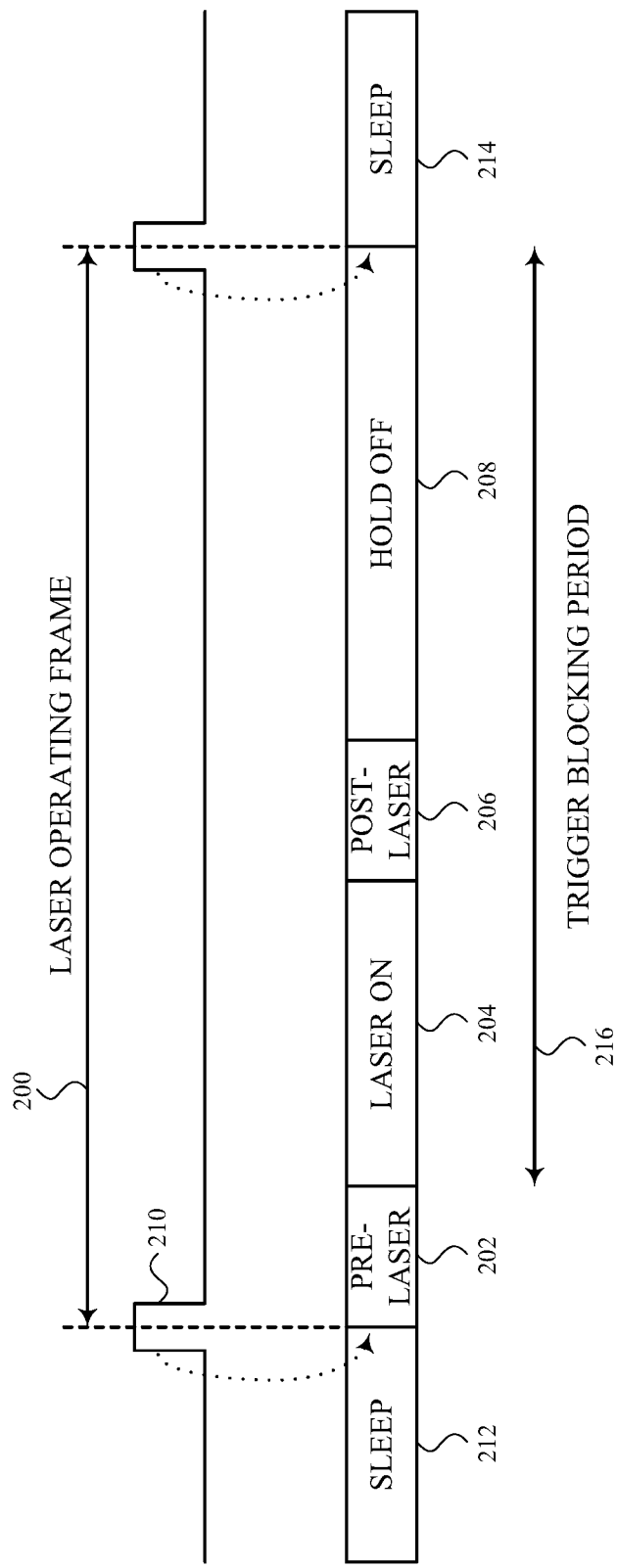
FIG. 2 shows an example operating frame for a laser.

FIG. 2 shows an example operating frame 200 for a laser. In some cases, the laser described with reference to FIG. 1 may be operated in accord with the operating frame 200. The operating frame 200 includes a pre-laser period 202, a laser ON period 204, a post-laser period 206, and a hold OFF period 208. A pulse of a trigger signal 210 may initiate the start of an operating frame 200.

During the pre-laser period 202, a control circuit for a laser may check various safety parameters for the laser, such as open/short conditions, operating temperature, and so on. During the laser ON period 204, the control circuit may turn the laser ON by raising the amplitude of the laser's drive current from a low (OFF) level to a high (ON) level. During the post-laser period 206, sensor data obtained in response to activating the laser (if any) may be analyzed, or other operations may be performed. During the hold OFF period 208, the control circuit may hold the laser in an OFF state and prohibit the laser from being turned ON.

In some cases, the operating frame 200 may be immediately preceded and followed by a sleep period 212 or 214. In other cases, the operating frame 200 may be immediately preceded or followed by another operating frame.

For a laser operated in accord with a fixed laser firing rate, the control circuit may enforce a maximum duty cycle of the laser, at least in part, by enforcing a trigger blocking period 216. During the trigger blocking period 216, a pulse of the trigger signal 210, if such a pulse were to be received, would be ignored. Thus, the laser may only be turned ON by means of a pulse of the trigger signal 210 received during the pre-laser period 202. The trigger blocking period 216 may or may not allow for some variability in the timing of the pulse of the trigger signal 210, but may not allow for variability in the lengths of the pre-laser period 202, the laser ON period 204, the post-laser period 206, or the hold OFF period 208. Thus, the maximum duty cycle of the laser (and really the fixed duty cycle of the laser, absent manufacturing tolerances or environmental effects) is equal to:

$$\frac{\text{(laser ON period)}}{\text{(pre-laser period)} + \text{(laser ON period)} + \text{(post-laser period)} + \text{(hold OFF period)}}$$

In some cases, adjustments in the duty cycle may be provided by programming the length of the hold OFF period 208. For example, the laser's control circuit may be configured to receive a programmed length of the hold OFF period 208 during manufacture (e.g., depending on manufacturing tolerances or the laser's application) or, alternatively, during use of the laser in the field (e.g., depending on the laser's application).

For a laser operated in accord with a variable laser firing rate, the duty cycle of the laser may be varied (e.g., the duty cycle may be varied from one operating frame to another operating frame). If the laser's duty cycle is adjusted such that an increase in the amplitude of the laser's drive current is offset by a decrease in the laser's duty cycle (i.e., a decrease in the laser's ON time during an operating frame), or if the amplitude of the laser's drive current is adjusted such that an increase in the laser's duty cycle (i.e., an increase in the laser's ON time during an operating frame) is offset by a decrease in the amplitude of the laser's drive current, the laser's average current may remain the same on a frame-by-frame basis. However, in some cases it may be desirable to exceed the allowed average current during one or more operating frames, but maintain the average current over a set of operating frames. In either case, the average current provided to the laser may need to be monitored, and operation of the laser may need to be modified (e.g., the laser may need to be shut off), when the average current is exceeded during one or more operating frames.

Figure 3:
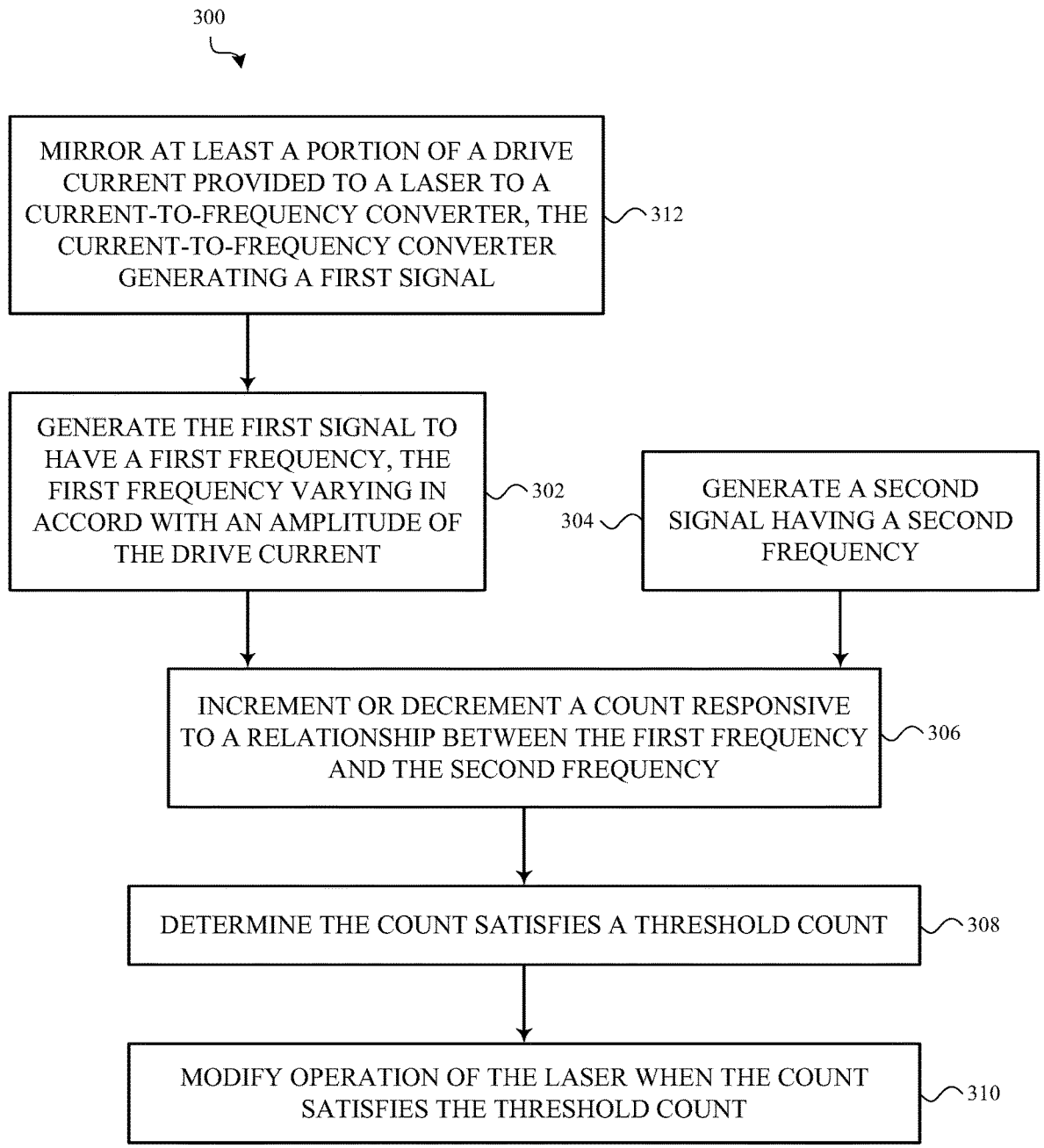
FIG. 3 shows an example method of operating a laser.

FIG. 3 shows an example method 300 of operating a laser. In some cases, the method 300 may be used to operate the laser described with reference to FIG. 1.

At block 302, the method 300 includes generating a first signal having a first frequency. The first frequency may vary in accord with an amplitude of a drive current provided to a laser. For example, when the laser is ON, the first frequency may be relatively greater, and when the laser is OFF, the first frequency may be relatively lower (and in some cases may be zero Hertz (Hz)). The first frequency may increase in proportion to the amplitude of the drive current, or have another relationship that varies in accord with the amplitude of the drive current.

At block 304, and in parallel with the operation(s) at block 302, the method 300 may include generating a second signal having a second frequency. The second frequency may be a fixed frequency.

At block 306, the method 300 may include incrementing or decrementing a count responsive to a relationship between the first frequency and the second frequency. For example, when the first frequency exceeds the second frequency, the count may be incremented. The amount of the increment may be proportional to the amount by which the first frequency exceeds the second frequency. When the second frequency exceeds the first frequency, the count may be decremented. The amount of the decrement may be proportional to the amount by which the second frequency exceeds the first frequency. In some cases, each increment and/or decrement may be performed in response to a rising or falling edge of a clock, which clock may have a period that is much shorter than the length of a laser operating frame.

At block 308, the method 300 may include determining the count satisfies a threshold count.

At block 310, the method 300 may include modifying operation of the laser when the count satisfies the threshold count. In some cases, modifying operation of the laser may include shutting off the laser.

Optionally, and at block 312, the method 300 may include mirroring at least a portion of the drive current provided to the laser to a current-to-frequency converter. The current-to-frequency converter may then generate the first signal at block 302. In some cases, the drive current may be mirrored to the current-to-frequency converter in accordance with a programmable gain. The programmable gain can help set or adjust the gain of the current-to-frequency converter. In some cases, the method 300 may include storing and/or selecting a value that determines the programmable gain for mirroring the drive current to the current-to-frequency converter. For example, such a value may be stored in a one-time programmable (OTP) register during calibration of a laser system. Alternatively, such a value may be stored in a register that may be reprogrammed, depending on a current application for which the laser is used.

In alternative embodiments of the method 300, the count may be incremented in response to the second frequency exceeding the first frequency, and decremented in response to the first frequency exceeding the second frequency. The count (or other sequence) may also be managed in other ways, so long as the different relationships between the first and second frequencies move the count (or other sequence) in opposing ways. When the first and second frequencies are equal, the count may not be incremented or decremented (or in other embodiments, equal frequencies may cause the count to be incremented or, alternatively, decremented.

The method 300 may be calibrated such that the average current trip signal will never be asserted, at block 306, under a first set of drive current and duty cycle combinations that is deemed "safe" on a per-operating frame basis. A second set of combinations of drive current and duty cycle will cause the average current drive signal to be asserted after a period of time. The period of time may depend on the amplitude of the drive current and/or the duty cycle, but will typically depend on a combination of the drive current and duty cycle. When the amplitude of the drive current is very high, the average current trip signal may be asserted before the end of an operating frame in which the high amplitude drive current begins, and may possibly be asserted after a single comparison of the first frequency and the second frequency. When the amplitude of the drive current is high, but not very high, the average current trip signal may be asserted after one, a few, several, or even many operating frames. It is also possible that operating frames in which the laser is operated at a higher amplitude drive current and/or duty cycle having a longer laser ON time may be preceded, followed, or interspersed with operating frames in which the laser is operated at a lower amplitude drive current and/or duty cycle having a shorter laser ON time, such that the count rises during some operating frames, falls during other operating frames, but over time remains steady enough such that the average current trip signal is not asserted.

In alternative embodiments of the method 300, the method 300 may include more, fewer, or alternative operations. Also, the operations of the method 300 may all be performed contemporaneously.

Figure 4:
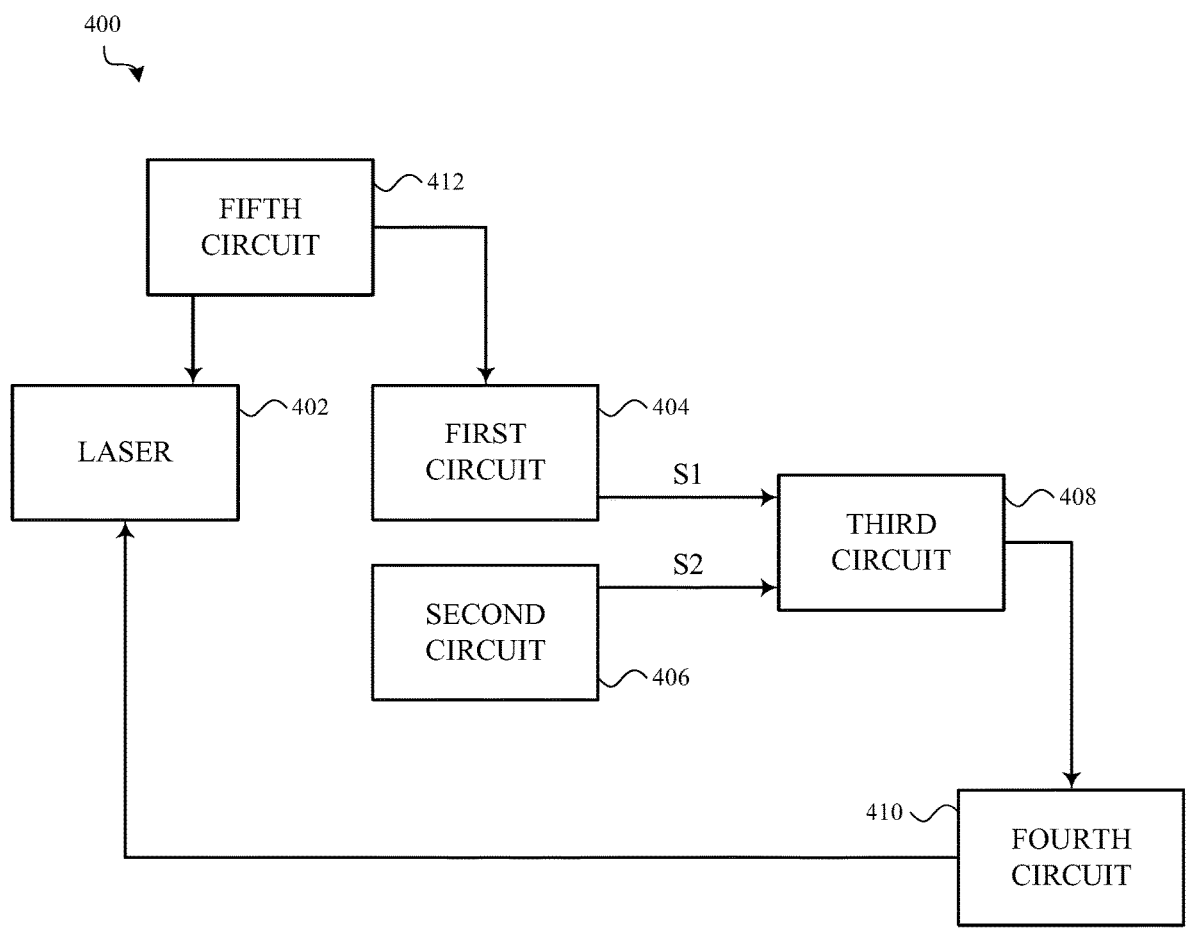
FIG. 4 shows an example block diagram of a laser safety circuit.

FIG. 4 shows an example block diagram of a laser safety circuit. The laser safety circuit 400 is an example of one of the laser safety circuits described with reference to FIG. 1, and may be used to perform the method described with reference to FIG. 3. The laser safety circuit 400 may help ensure safe operation of a laser 402. By way of example, the laser 402 may be a semiconductor laser diode having a resonant cavity bounded by DBRs. In some embodiments, the laser 402 may be configured as an EEL, a VCSEL, or a HCSEL.

The laser safety circuit 400 may include various sub-circuits (or just circuits), such as the first through fifth circuits 404-412 described below. However, it is noted that two or more (or all) of the circuits 404-412 described below may be subdivided or integrated to include more or fewer circuits that perform the described functions. Some circuits may also perform additional functions.

A first circuit 404 may be configured to generate a first signal (S1) having a first frequency. The first frequency may vary in accord with an amplitude of a drive current ($I_d$) provided to the laser 402.

A second circuit 406 may be configured to generate a second signal (S2) having a second frequency. The second frequency may be a fixed frequency.

The first and second signals may be received by a third circuit 408 (e.g., a frequency comparator), which may be configured to periodically increment or decrement a count responsive to a relationship between the first frequency and the second frequency. For example, when the first frequency exceeds the second frequency, the count may be incremented. The amount of the increment may be proportional to the amount by which the first frequency exceeds the second frequency. When the second frequency exceeds the first frequency, the count may be decremented. The amount of the decrement may be proportional to the amount by which the second frequency exceeds the first frequency. The count may be additionally or alternatively maintained or updated as described with reference to FIG. 3.

When the count satisfies a threshold count, the third circuit 408 may assert an average current trip signal.

A fourth circuit 410 may be configured to modify operation of the laser 402 responsive to the assertion of the average current trip signal. Operation of the laser 402 may be modified, for example, by shutting off the laser 402.

In some embodiments, a fifth circuit 412 may be configured to mirror at least a portion of the drive current provided to the laser 402 to an input of the first circuit 404. The first signal may then be generated in response to the at least portion of the drive current (which portion of the drive current is proportional to the total drive current).

The circuits 404-412 may be configured such that the third circuit 408 will never assert the average current trip signal under a set of drive current and duty cycle combinations that are deemed "safe" on a per-operating frame basis. Other combinations of drive current and duty cycle will cause the third circuit 408 to assert the average current drive signal after a period of time. The period of time may depend on the amplitude of the drive current and/or the duty cycle, but will typically depend on a combination of the drive current and duty cycle. When the amplitude of the drive current is very high, the average current trip signal may be asserted before the end of an operating frame in which the high amplitude drive current begins, and may possibly be asserted after a single comparison of the first frequency and the second frequency. When the amplitude of the drive current is high, but not very high, the average current trip signal may be asserted after one, a few, several, or even many operating frames. It is also possible that operating frames in which the laser is operated at a higher amplitude drive current and/or duty cycle having a longer laser ON time may be preceded, followed, or interspersed with operating frames in which the laser is operated at a lower amplitude drive current and/or duty cycle having a shorter laser ON time, such that the count maintained by the third circuit 408 rises during some operating frames, falls during other operating frames, but over time remains steady enough such that the average current trip signal is not asserted.

Figure 5:
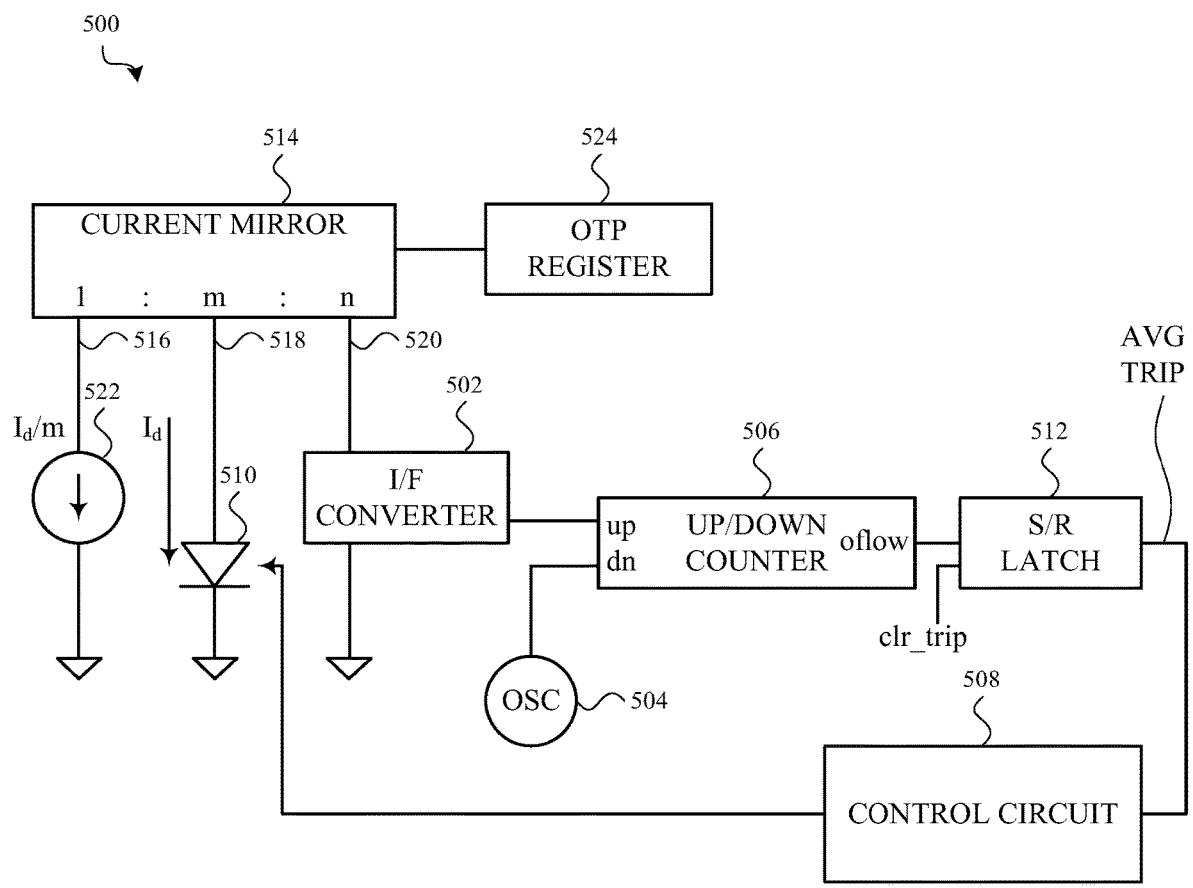
FIG. 5 shows an example schematic of a laser safety circuit.

FIG. 5 shows an example schematic of a laser safety circuit. The laser safety circuit 500 is an example of one of the laser safety circuits described with reference to FIG. 1 or 4, and may be used to perform the method described with reference to FIG. 3. The laser safety circuit 500 may include a current-to-frequency converter 502, an oscillator 504, an up/down counter 506, and a control circuit 508.

The current-to-frequency (I/F) converter 502 may be configured to generate a first signal (S1) modulated at a first frequency. The first frequency may vary in accord with an amplitude of a drive current ($I_d$) provided to a laser 510 (e.g., a laser diode (D)). In some embodiments, the laser 510 may be configured as an EEL, a VCSEL, or a HCSEL.

The oscillator 504 may be configured to generate a second signal (S2) having a second frequency. The second frequency may be a fixed frequency.

The first and second signals may be received by the up/down counter 506, which may be configured to periodically increment or decrement a count responsive to a relationship between the first frequency and the second frequency. For example, when the first frequency exceeds the second frequency, the count may be incremented. The amount of the increment may be proportional to the amount by which the first frequency exceeds the second frequency. When the second frequency exceeds the first frequency, the count may be decremented. The amount of the decrement may be proportional to the amount by which the second frequency exceeds the first frequency. The count may be additionally or alternatively maintained or updated as described with reference to FIG. 3. In some cases, each increment and/or decrement may be performed in response to a rising or falling edge of a clock, which clock may have a period that is much shorter than the length of a laser operating frame.

When the count satisfies a threshold count, the up/down counter 506 may assert an average current trip signal. The average current trip signal may in some cases take the form of an overflow output of the up/down counter 506. Optionally, a latch 512 (e.g., a set/reset (S/R) latch) may latch an assertion of the average current trip signal (e.g., as Avg Trip). Alternatively, the control circuit 508 may detect the up/down counter's assertion of the average current trip signal. The latch 512 may be cleared by pulsing a clear signal (clr_trip).

The control circuit 508 may be configured to modify operation of the laser 510 responsive to the assertion of the average current trip signal (e.g., by receiving the overflow (oflow) output of the up/down counter 506 directly, or by receiving the Avg Trip signal output by the latch 512). Operation of the laser 510 may be modified, for example, by shutting off the laser 510.

In some embodiments, the laser safety circuit 500 may include a current mirror 514. The current mirror 514 may have first, second, and third legs 516, 518, 520. The first leg 516 may be coupled to a current source 522; the second leg 518 may be coupled to the laser 510; and the third leg 520 may be coupled to the current-to-frequency converter 502.

The first leg 516 may be operable to carry a current (e.g., $I_d/m$) generated by the current source 522. The current mirror 514 may mirror the current carried on the first leg 516 to the second leg 518 and the third leg 520. The mirrored current carried by the second leg 518 may be provided to the laser 510 as a drive current ($I_d$).

In some cases, the current mirror may have a programmable gain for mirroring current to the second leg 518 or the third leg 520. For example, a register 524 (e.g., a one-time programmable (OTP) register) may store a value that determines the programmable gain for mirroring the drive current to the third leg 520.

Figure 6A:
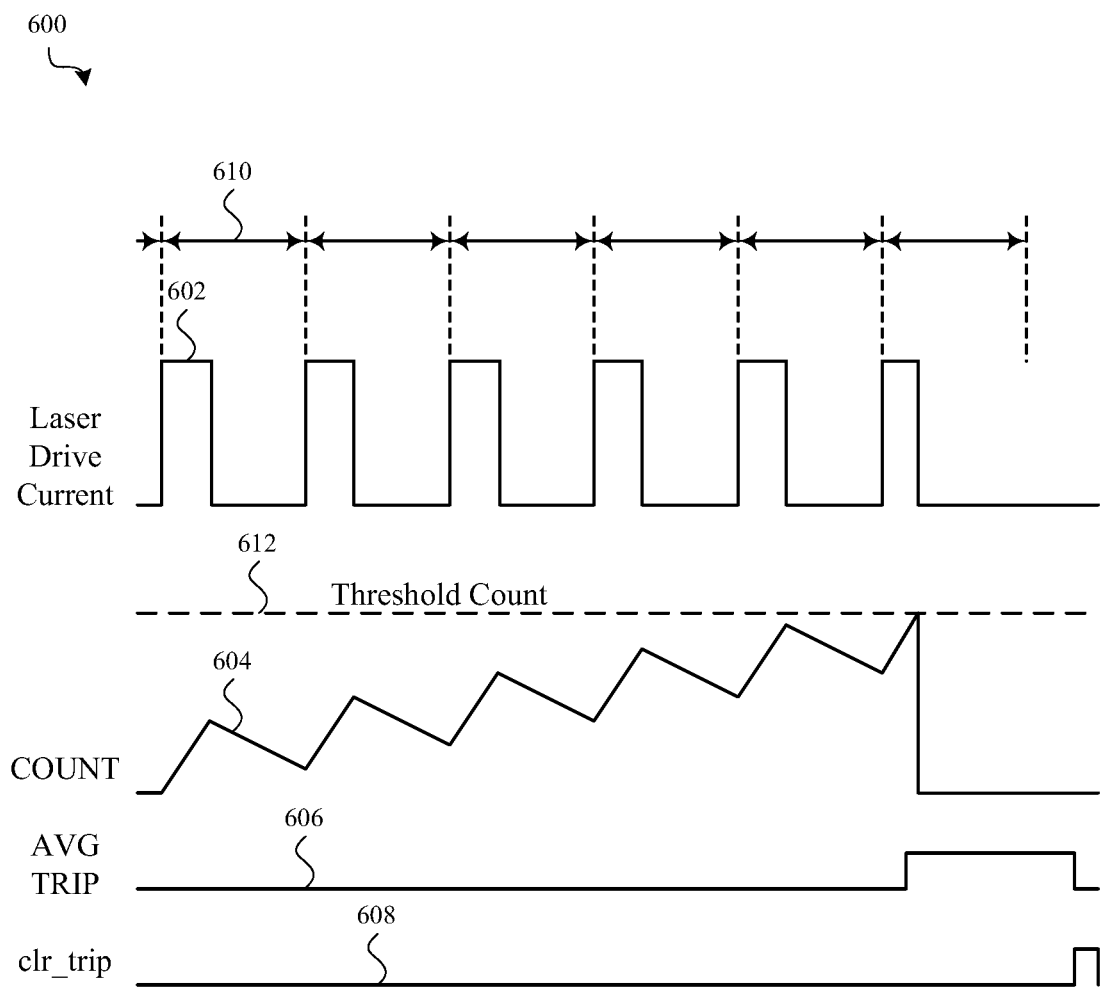
FIG. 6A shows an example steady state timing diagram for the laser safety circuit described with reference to FIG. 5.
Figure 6B:
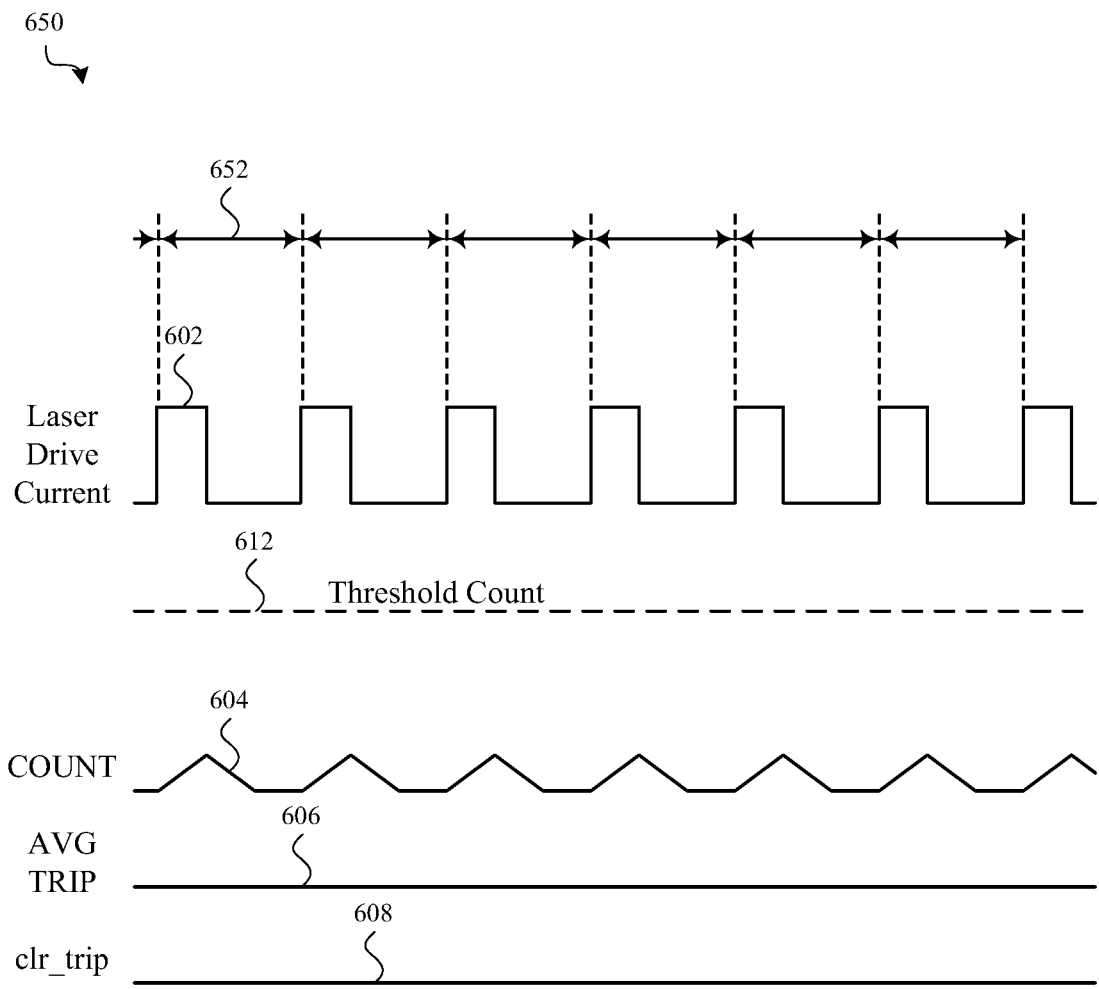
FIG. 6B shows an example average current trip diagram for the laser safety circuit described with reference to FIG. 5.

FIGS. 6A and 6B show example timing diagrams for the laser safety circuit 500 described with reference to FIG. 5. In particular, FIG. 6A shows an example steady state timing diagram 600 for the laser safety circuit 500, and FIG. 6B shows an example average current trip diagram 650 for the laser safety circuit 500. Each of FIGS. 6A and 6B shows the laser drive current ($I_d$) 602, the cumulative value of the count (COUNT) 604, the latched value of the average current trip signal (AVG TRIP) 606, and the latch clear signal (clr_trip) 608.

By way of example, the laser drive current 602 may be turned ON for a portion of each of a number of operating frames 610 of the laser 510. The portion of an operating frame for which the laser drive current 602 is turned on is determined by a fixed or programmable duty cycle of the laser 510. In some cases, the duty cycle may vary from one operating frame 610 to another. The amplitude of the laser drive current 602 may also be fixed or programmable. For example, the amplitude of the laser drive current 602 is different in the operating frames 610 (shown in FIG. 6A) and 652 (shown in FIG. 6B).

As shown in both of FIGS. 6A and 6B, the Count 604 may increase when the laser 510 is ON and decrease when the laser 510 is OFF, with the rate of increase depending on the amplitude of the laser drive current 602. The Count 604 increases because the frequency of the first signal (S1) shown in FIG. 5 is greater than the frequency of the second signal (S2) shown in FIG. 5. The Count 604 decreases when the frequency of the first signal (S1) is less than the frequency of the second signal (S2). The Count 604 may have a lower limit (e.g., 0), with further decrement indications being ignored.

As shown in FIG. 6A, some combinations of amplitude and duty cycle of the laser drive current 602 may result in the Count 604 returning to zero before the end of each frame. However, as shown in FIG. 6B, there may be scenarios in which a higher amplitude or duty cycle of the laser drive current 602 pushes the value of the Count 604 higher over time. When the Count 604 satisfies (e.g., exceeds) a threshold count 612, the average current trip signal 606 may be asserted, causing the control circuit 508 to modify operation of the laser 510 (e.g., shut the laser 510 OFF). After performing laser safety checks, and possibly modifying the amplitude or duty cycle of the laser drive current 602, the latch 512 may be reset by pulsing the latch clear signal 608, and operation of the laser 510 may resume.

Figure 7:
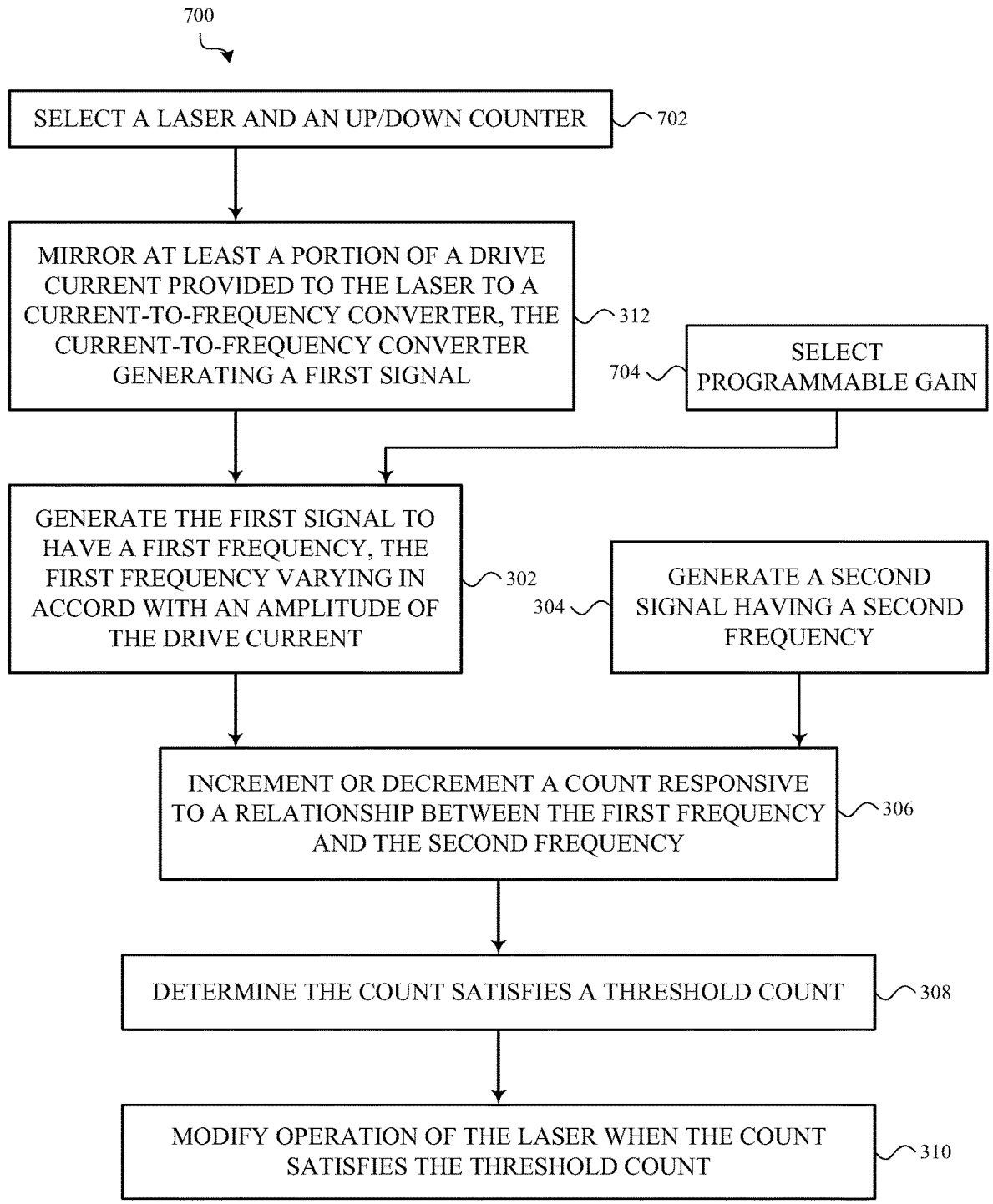
FIG. 7 shows an example modification of the method described with reference to FIG. 3.

FIG. 7 shows an example modification of the method described with reference to FIG. 3. The method 700 is similar to the method described with reference to FIG. 3, but includes additional operations. For example, at block 702, the method 700 may include selecting a laser from a set of lasers, and selecting a counter to increment or decrement. The counter may be selected from a set of counters, and different counters in the set of counters may be associated with different lasers in the set of lasers.

The method 700 is therefore capable of performing the method described with reference to FIG. 3 for different lasers, without having to replicate the entire structure of the laser safety circuit that performs the method.

At block 704, the method 700 may optionally include selecting, from a stored set of values that determine the programmable gain for mirroring current to the current-to-frequency converter, a value corresponding to the selected laser.

In alternative embodiments of the method 300, the method 300 may include more, fewer, or alternative operations. Also, the operations of the method 300 may all be performed contemporaneously.

Figure 8:
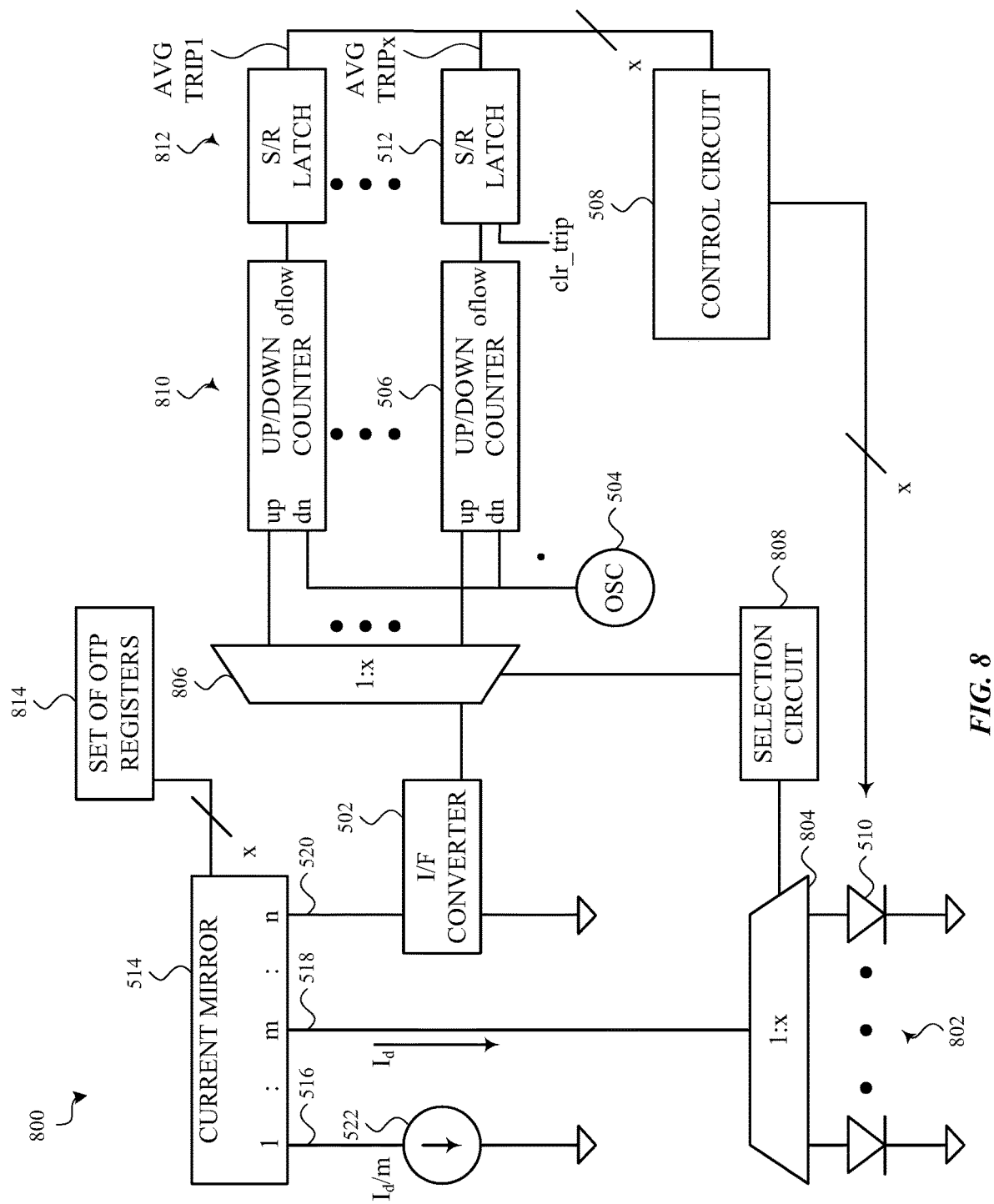
FIG. 8 shows an example modification of the laser safety circuit described with reference to FIG. 5, to perform the modified method described with reference to FIG. 7.

FIG. 8 shows an example modification of the laser safety circuit described with reference to FIG. 5 to perform the modified method described with reference to FIG. 7. The laser safety circuit 800 is similar to the laser safety circuit described with reference to FIG. 5, but includes a set of lasers 802 including the laser 510, first and second multiplexers 804, 806, a selection circuit 808, a set of up/down counters 810 including the up/down counter 506, a set of latches 812 including the latch 512, and an optional set of registers 814 including the register 524. In some embodiments, the selection circuit 808 may be part of the control circuit 508.

The first multiplexer 804 has an output coupled to the second leg 518 of the current mirror 514, a set of inputs coupled to respective lasers in the set of lasers 802, and one or more select inputs coupled the selection circuit 808. The first multiplexer 804 may be configured to couple a laser, selected from the set of lasers 802, into the second leg 518 of the current mirror 514. The first multiplexer 804 may be programmed by the selection circuit 808.

The second multiplexer 806 has an input coupled to the output of the current-to-frequency converter 502, a set of outputs coupled to respective up/down counters in the set of up/down counters 810, and one or more select inputs coupled to the selection circuit 808. The second multiplexer 806 may be configured to provide the first signal (S1) to an up/down counter selected from the set of up/down counters 810. The second multiplexer 806 may be programmed by the selection circuit 808.

Optionally, a third multiplexer may be programmed, by the selection circuit 808, to select a register, in the set of registers 814, corresponding to a selected laser in the set of lasers 802. In this manner, a value appropriate for the selected laser may be used to program the gain of the third leg 520 of the current mirror 514.

As shown in FIG. 8, the laser safety circuit 800 shares much of the circuit structure of the laser safety circuit described with reference to FIG. 5. This helps to reduce the power consumption, area, and manufacturing cost of the laser safety circuit 800 (e.g., in comparison to replicating the laser safety circuit described with reference to FIG. 5 for each laser in a set of lasers).

Figure 9A:
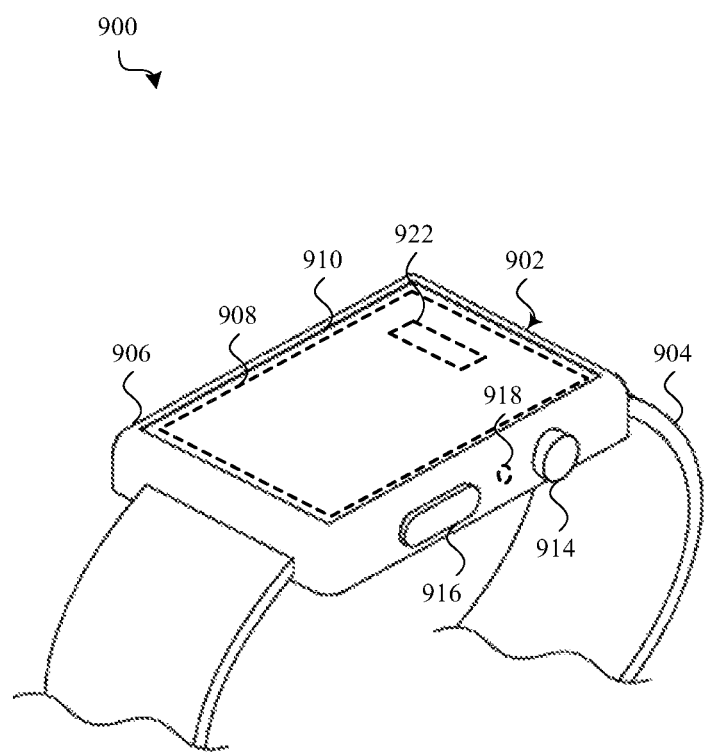
FIGS. 9A and 9B show an example electronic device.
Figure 9B:
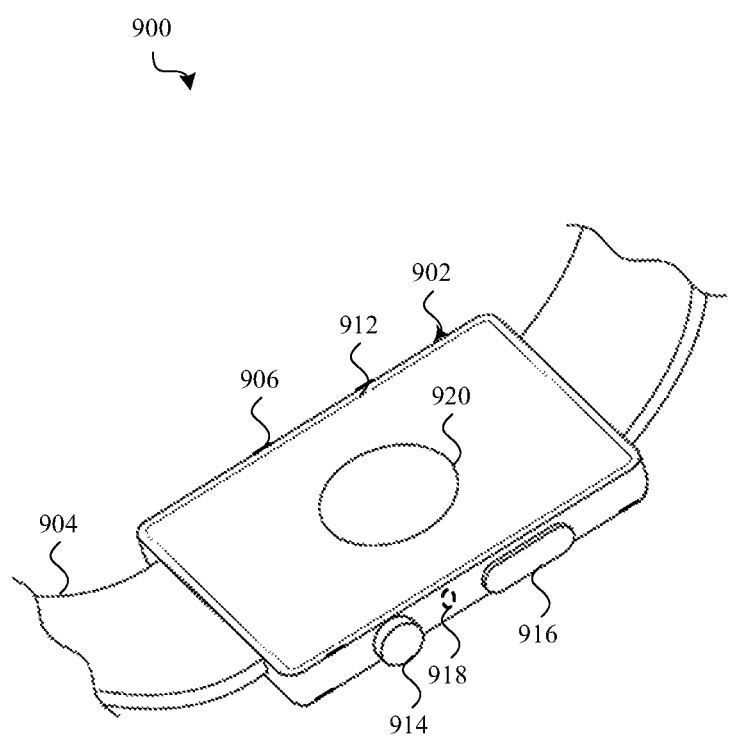

FIGS. 9A and 9B show an example of a device 900 (e.g., an electronic device) that may include a laser and a laser safety circuit. The laser and laser safety circuit may be configured as described herein. The device's dimensions and form factor, and inclusion of a band 904, suggest that the device 900 is an electronic watch. However, the device's dimensions and form factor are arbitrarily chosen, and the device 900 could alternatively be any portable electronic device including, for example, a mobile phone, tablet computer, portable computer, portable music player, health monitor device, portable terminal, vehicle navigation system, robot navigation system, other type of wearable device (e.g., a head-mounted display (HMD), glasses, earphone or earbud, and so on), or other portable or mobile device. The device 900 could also be a device that is semi-permanently located (or installed) at a single location. FIG. 9A shows a front isometric view of the device 900, and FIG. 9B shows a rear isometric view of the device 900.

The device 900 may include a body 902 (e.g., a watch body) and a band 904. The watch body 902 may include an input or selection device, such as a crown 914 or a button 916. The band 904 may be used to attach the watch body 902 to a body part (e.g., an arm, wrist, leg, ankle, or waist) of a user. A housing of the watch body 902 may include a sidewall 906 that at least partially surrounds a display 908. The sidewall 906 may support other housing components, such as a front cover 910 (FIG. 9A) or a rear cover 912 (FIG. 9B). The front cover 910 may be positioned over the display 908, and may provide a window through which the display 908 may be viewed. In some embodiments, the display 908 may be attached to (or abut) the sidewall 906 and/or the front cover 910. In alternative embodiments of the device 900, the display 908 may not be included and/or the sidewall 906 may have an alternative configuration.

The various components of the device's housing (e.g., the sidewall 906, the front cover 910, and the rear cover 912) may be formed from the same or different materials. In some cases, the sidewall 906 may be formed using one or more metals (e.g., stainless steel), polymers (e.g., plastics), ceramics, or composites (e.g., carbon fiber). The front cover 910 may be formed, for example, using one or more of glass, a crystal (e.g., sapphire), or a transparent polymer (e.g., plastic) that enables a user to view the display 908 through the front cover 910. In some cases, a portion of the front cover 910 (e.g., a perimeter portion of the front cover 910) may be coated with an opaque ink to obscure components included within the housing. The rear cover 912 may be formed using the same material(s) that are used to form the sidewall 906 or the front cover 910. In some cases, the rear cover 912 may be part of a monolithic element that also forms the sidewall 906. In still other embodiments, all of the exterior components of the housing may be formed from a transparent material, and components within the device 900 may or may not be obscured by an opaque ink or opaque structure within the housing.

The front cover 910 may be mounted to the sidewall 906 to cover an opening defined by the sidewall 906 (i.e., an opening into an interior volume in which various electronic components of the device 900, including the display 908, may be positioned). The front cover 910 may be mounted to the sidewall 906 using fasteners, adhesives, seals, gaskets, or other components.

A display stack or device stack (hereafter referred to as a "stack") including the display 908 may be attached (or abutted) to an interior surface of the front cover 910 and extend into the interior volume of the device 900. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 910 (e.g., to a display surface of the device 900).

The display 908 may include one or more light-emitting elements and may be configured, for example, as a light-emitting diode (LED) display, an organic LED (OLED), a liquid crystal display (LCD), an electroluminescent (EL) display, or other type of display. In some embodiments, the display 908 may include, or be associated with, one or more touch, force, and/or pressure sensors that are configured to detect a touch, force, and/or pressure applied to a surface of the front cover 910.

The device 900 may include various sensor systems. For example, the device 900 may include one or more cameras, speakers, microphones, or other components (e.g., audio, imaging, and/or sensing components) that are configured to transmit or receive signals to/from the device 900. In some embodiments, the device 900 may have a port 918 (or set of ports) on the sidewall 906 (or elsewhere), and an ambient pressure sensor, ambient temperature sensor, internal/external differential pressure sensor, gas sensor, particulate matter sensor, or air quality sensor may be positioned in or near the port(s) 918.

In some cases, the rear surface (or skin-facing surface) of the device 900 may include a flat or raised area 920 that includes one or more skin-facing sensors. For example, the area 920 may include a heart-rate monitor, a respiration-rate monitor, or a blood pressure monitor. The area 920 may also include an off-wrist detector or other sensor.

In some cases, one or more cameras, sensors, light sources, or I/O devices 922 of the device 900 (or of the device's band 904 or band attachment mechanism) may include one or lasers and laser safety circuits configured as described herein. The laser(s) may variously emit light through the front cover 910 (or output surface of the display 908), the rear cover 912, a surface of the crown 914, or a surface of the button 916. Such laser(s) may be used for visible or invisible (e.g., infrared) illumination of a person (e.g., a face) or an object; for sensing purposes (e.g., as self-mixing interference (SMI) sensors, line scanners, dot scanners, and so on); for measurement purposes (e.g., for time-of-flight measurements); and so on. The laser safety circuit(s) may help to protect a user or other persons from operation of the device 900 outside of laser safety specifications.

Figure 10:
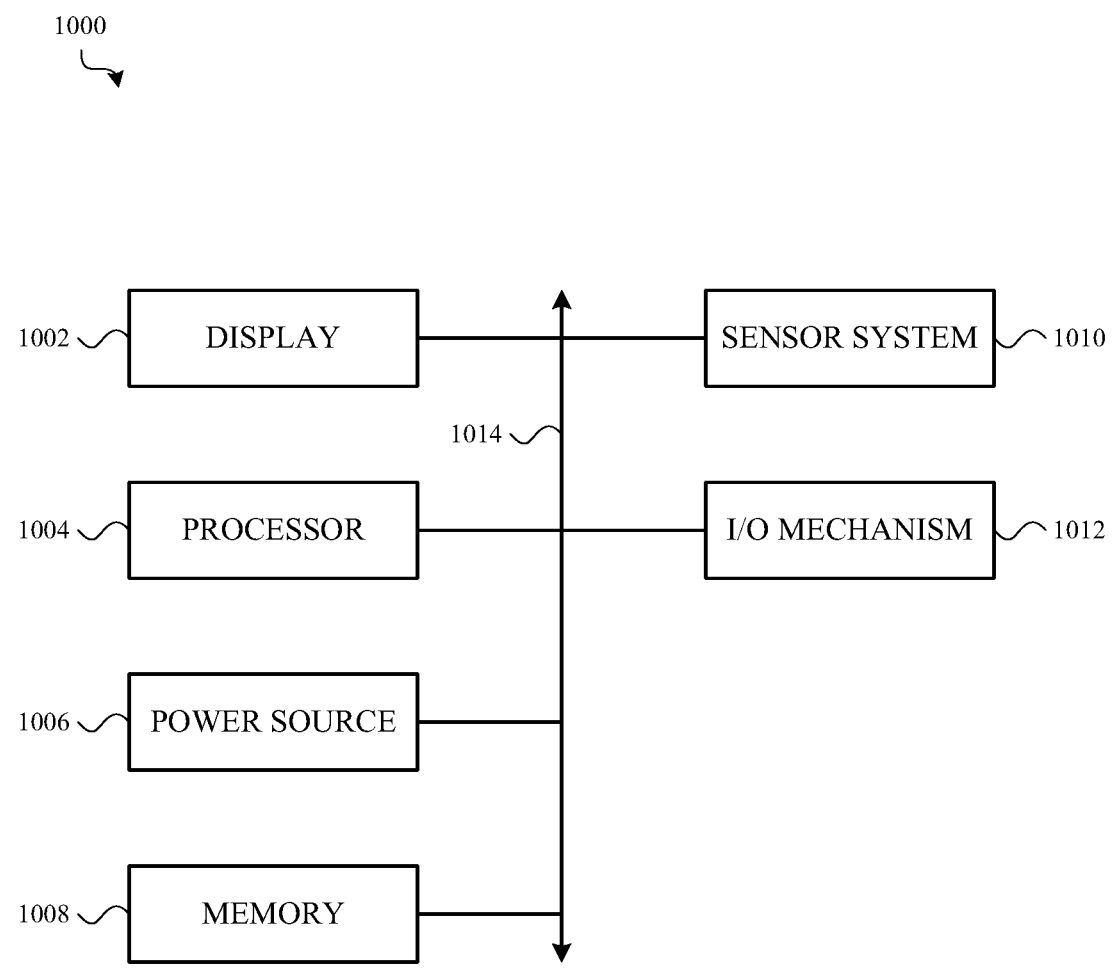
FIG. 10 shows an example block diagram of an electronic device.

FIG. 10 shows a sample electrical block diagram of an electronic device 1000, which electronic device may in some cases take the form of the device described with reference to FIGS. 9A and 9B and/or include one or more of the lasers and laser safety circuits described (e.g., as described with reference to any of FIGS. 1-8). The electronic device 1000 may include a display 1002 (e.g., a light-emitting display), a processor 1004, a power source 1006, a memory 1008 or storage device, a sensor system 1010, or an input/output (I/O) mechanism 1012 (e.g., an input/output device, input/output port, or haptic input/output interface). The processor 1004 may control some or all of the operations of the electronic device 1000. The processor 1004 may communicate, either directly or indirectly, with some or all of the other components of the electronic device 1000. For example, a system bus or other communication mechanism 1014 can provide communication between the display 1002, the processor 1004, the power source 1006, the memory 1008, the sensor system 1010, and the I/O mechanism 1012.

The processor 1004 may be implemented as any electronic device capable of processing, receiving, or transmitting data or instructions, whether such data or instructions is in the form of software or firmware or otherwise encoded. For example, the processor 1004 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements.

It should be noted that the components of the electronic device 1000 can be controlled by multiple processors. For example, select components of the electronic device 1000 (e.g., the sensor system 1010) may be controlled by a first processor and other components of the electronic device 1000 (e.g., the display 1002) may be controlled by a second processor, where the first and second processors may or may not be in communication with each other.

The power source 1006 can be implemented with any device capable of providing energy to the electronic device 1000. For example, the power source 1006 may include one or more batteries or rechargeable batteries. Additionally or alternatively, the power source 1006 may include a power connector or power cord that connects the electronic device 1000 to another power source, such as a wall outlet.

The memory 1008 may store electronic data that can be used by the electronic device 1000. For example, the memory 1008 may store electrical data or content such as, for example, audio and video files, documents and applications, device settings and user preferences, timing signals, control signals, and data structures or databases. The memory 1008 may include any type of memory. By way of example only, the memory 1008 may include random access memory, read-only memory, Flash memory, removable memory, other types of storage elements, or combinations of such memory types.

The electronic device 1000 may also include one or more sensor systems 1010 positioned almost anywhere on the electronic device 1000. In some cases, sensor systems 1010 may be positioned as described with reference to FIGS. 9A and 9B. The sensor system(s) 1010 may be configured to sense one or more types of parameters, such as but not limited to, light; touch; force; heat; movement; relative motion; biometric data (e.g., biological parameters) of a user; particulate matter concentration, air quality; proximity; position; connectedness; and so on. By way of example, the sensor system(s) 1010 may include a heat sensor, a position sensor, a light or optical sensor, an accelerometer, a pressure transducer, a gyroscope, a magnetometer, a health monitoring sensor, a particulate matter sensor, an air quality sensor, and so on. Additionally, the one or more sensor systems 1010 may utilize any suitable sensing technology, including, but not limited to, magnetic, capacitive, ultrasonic, resistive, optical, acoustic, piezoelectric, or thermal technologies. In some cases, one or more of the sensor system(s) 1010 may include one or more lasers and laser safety circuits as described herein.

The I/O mechanism 1012 may transmit or receive data from a user or another electronic device. The I/O mechanism 1012 may include the display 1002, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1012 may transmit electronic signals via a communications interface, such as a wireless, wired, and/or optical communications interface. Examples of wireless and wired communications interfaces include, but are not limited to, cellular and Wi-Fi communications interfaces. In some cases, the I/O mechanism 1012 may include one or more lasers and laser safety circuits as described herein.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data available from various sources, including biometric data (e.g., face or fingerprint data). The present disclosure contemplates that, in some instances, this gathered data may include personal information data that uniquely identifies or can be used to identify, locate, or contact a specific person. Such personal information data can include, for example, biometric data (e.g., fingerprint data) and data linked thereto (e.g., demographic data, location-based data, telephone numbers, email addresses, home addresses, data or records relating to a user's health or level of fitness (e.g., vital signs measurements, medication information, exercise information), date of birth, or any other identifying or personal information).

The present disclosure recognizes that the use of such personal information data, in the present technology, can be used to the benefit of users. For example, the personal information data can be used to authenticate a user to access their device, or gather performance metrics for the user's interaction with an augmented or virtual world. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide data to targeted content delivery services. In yet another example, users can select to limit the length of time data is maintained or entirely prohibit the development of a baseline profile for the user. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. A laser safety circuit, comprising:
   a current-to-frequency converter configured to generate a first signal modulated at a first frequency, the first frequency varying in accord with an amplitude of a drive current provided to a laser;
   an oscillator configured to generate a second signal having a second frequency;
   an up/down counter configured to periodically increment or decrement a count responsive to a relationship between the first frequency and the second frequency, and assert an average current trip signal when the count satisfies a threshold count; and a control circuit configured to modify operation of the laser responsive to the assertion of the average current trip signal.

2. The laser safety circuit of claim 1, further comprising:
a current source; and
a current mirror having,
 a first leg coupled to the current source;
 a second leg operable to carry the drive current; and
 a third leg coupled to an input of the current-to-frequency converter.

3. The laser safety circuit of claim 2, wherein the current mirror has a programmable gain for mirroring current to the third leg.

4. The laser safety circuit of claim 3, further comprising:
a register storing a value that determines the programmable gain for mirroring current to the third leg.

5. The laser safety circuit of claim 2, further comprising:
a first multiplexer configured to couple the laser into the second leg of the current mirror, the laser selected from a set of lasers;
a set of up/down counters including the up/down counter;
a second multiplexer configured to provide the first signal to a selected up/down counter in the set of up/down counters; and
a selection circuit configured to program the first multiplexer and the second multiplexer.

6. The laser safety circuit of claim 5, wherein the current mirror has a programmable gain for mirroring the drive current to the third leg.

7. The laser safety circuit of claim 6, further comprising:
a set of registers configured to store a set of values that determines the programmable gain for mirroring current to the current-to-frequency converter; wherein,
the selection circuit is configured to select a register, in the set of registers, corresponding to the selected laser.

8. The laser safety circuit of claim 1, further comprising:
a latch configured to latch the assertion of the average current trip signal.

9. The laser safety circuit of claim 1, wherein:
the control circuit is configured to modify operation of the laser, responsive to the assertion of the average current trip signal, by shutting off the laser.

10. An electronic device, comprising:
a laser;
a first circuit configured to generate a first signal having a first frequency, the first frequency varying in accord with an amplitude of a drive current provided to the laser;
a second circuit configured to generate a second signal having a second frequency;
a third circuit configured to periodically increment or decrement a count responsive to a relationship between the first frequency and the second frequency, and to assert an average current trip signal when the count satisfies a threshold count; and
a fourth circuit configured to modify operation of the laser responsive to the assertion of the average current trip signal.

11. The electronic device of claim 10, further comprising:
a fifth circuit configured to mirror at least a portion of the drive current provided to the laser to an input of the first circuit; wherein,
the first signal is generated in response to the at least portion of the drive current.

12. A method of operating a laser, comprising:
generating a first signal having a first frequency, the first frequency varying in accord with an amplitude of a drive current provided to the laser;
generating a second signal having a second frequency;
incrementing or decrementing a count responsive to a relationship between the first frequency and the second frequency;
determining the count satisfies a threshold count; and
modifying operation of the laser when the count satisfies the threshold count.

13. The method of claim 12, further comprising:
mirroring at least a portion of the drive current provided to the laser to a current-to-frequency converter, the current-to-frequency converter generating the first signal.

14. The method of claim 13, wherein the drive current is mirrored to the current-to-frequency converter in accordance with a programmable gain.

15. The method of claim 14, further comprising:
selecting a value that determines the programmable gain for mirroring the drive current to the current-to-frequency converter.

16. The method of claim 13, further comprising:
selecting the laser from a set of lasers; and
selecting a counter to increment or decrement the count, the counter selected from a set of counters, and different counters in the set of counters associated with different lasers in the set of lasers.

17. The method of claim 16, wherein the drive current is mirrored to the current-to-frequency converter in accordance with a programmable gain.

18. The method of claim 17, further comprising:
storing a set of values that determines the programmable gain for mirroring current to the current-to-frequency converter; and
selecting, from the set of values, a value corresponding to the selected laser.

19. The method of claim 12, further comprising:
latching an average current trip signal when the count satisfies the threshold count.

20. The method of claim 12, wherein:
modifying operation of the laser comprises shutting off the laser.

* * * * *